United States Patent
Matsue

(10) Patent No.: US 7,050,333 B2
(45) Date of Patent: May 23, 2006

(54) NONVOLATILE SEMICONDUCTOR MEMORY DEVICE

(75) Inventor: Kazuki Matsue, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 151 days.

(21) Appl. No.: 10/830,783

(22) Filed: Apr. 22, 2004

(65) Prior Publication Data

US 2004/0213068 A1   Oct. 28, 2004

(30) Foreign Application Priority Data

Apr. 25, 2003   (JP) .............................. 2003-120923

(51) Int. Cl.
*G11C 16/04* (2006.01)
(52) U.S. Cl. ................... 365/185.28; 365/210
(58) Field of Classification Search ........... 365/185.28, 365/210, 185.29, 185.2
See application file for complete search history.

(56) References Cited

U.S. PATENT DOCUMENTS

| | | | |
|---|---|---|---|
| 5,390,148 A * | 2/1995 | Saito | 365/185.08 |
| 6,002,630 A | 12/1999 | Chuang et al. | |
| 6,044,014 A * | 3/2000 | Komori et al. | 365/185.04 |
| 6,522,581 B1 | 2/2003 | Takata et al. | |
| 6,735,121 B1 * | 5/2004 | Yoshida | 365/185.22 |
| 6,816,409 B1 * | 11/2004 | Tanaka | 365/185.03 |
| 2002/0145906 A1 | 10/2002 | Einaga et al. | |

FOREIGN PATENT DOCUMENTS

| | | |
|---|---|---|
| JP | 8-64000 | 3/1996 |
| JP | 10-228792 A1 | 8/1998 |
| JP | 11-86580 | 3/1999 |

OTHER PUBLICATIONS

Austrian Patent Office search report mailed on Oct. 11, 2004 for Austrian patent application No. 200402164-8 filed on Apr. 20, 2004, 6 pages.

* cited by examiner

*Primary Examiner*—Anh Phung
(74) *Attorney, Agent, or Firm*—Morrison & Foerster LLP

(57) ABSTRACT

An object of the present invention is to provide a nonvolatile semiconductor memory device having a storage region constructed by a plurality of electrically rewritable nonvolatile memory cells and a booster circuit for boosting a power source voltage to thereby generate a voltage necessary to rewrite the storage region, wherein the power source voltage can be prevented from being decreased in the device and data in the storage region can be stably rewritten. The nonvolatile semiconductor memory device has a voltage determining part for determining a voltage level of a predetermined node in the semiconductor memory device in rewriting of the storage region, and a rewrite unit determining part for determining the number of bits of input data to be rewritten at once on the basis of a result of determination of the voltage determining part.

19 Claims, 13 Drawing Sheets

NONVOLATILE SEMICONDUCTOR MEMORY DEVICE

BACKGROUND OF THE INVENTION

1. Field of the Invention

The present invention relates to a nonvolatile semiconductor memory device such as a flash memory having a storage region constructed by a plurality of electrically rewritable nonvolatile memory cells and a booster circuit for boosting a power source voltage to generate a voltage necessary to rewrite the storage region. The present invention also relates to an IC module and an IC card each having the nonvolatile memory device and, more particularly, to a power consumption adjusting function (power management function) of the IC module and the IC card.

2. Description of the Related Art

An example of a nonvolatile semiconductor memory device having a storage region constructed by a plurality of electrically rewritable nonvolatile memory cells may include a flash memory. FIG. 4 shows the structure of a typical cell in a flash memory. The cell has a configuration capable of storing data of one bit (two values) or three or more values per one cell, and is constructed by a control gate 51, a floating gate 52, a source 53 and a drain 54. The cell is called a floating gate-type field effect transistor. The source 53 is provided commonly for memory cells of a predetermined amount (e.g., a block). A memory array (memory array block) has "n×m" memory cells arranged in an array as shown in FIG. 5. The memory array has "m" word lines connected to "n" control gates of each memory cell column and "n" bit lines connected to "m" drains in each memory cell row.

Next, the operation of the flash memory will be briefly described. Data is programmed to a memory cell by applying a high voltage (e.g., 12 V) from a selected word line to the control gate; applying a high voltage (e.g., 7 V) from a selected bit lint to the drain; applying a low voltage (e.g., 0 V) to the source; and injecting hot electrons generated in the vicinity of the drain junction to the floating gate.

On the other hand, data in the memory cell is erased by applying a low voltage (e.g., 0 V) to the control gate; applying a low voltage (e.g., 0 V) to the drain; applying a high voltage (e.g., 12 V) to the source; generating a high electric field between the floating gate and the source; and extracting electrons in the floating gate to the source side by using the tunnel effect.

In the flash memory, the threshold voltage of the floating gate-type field effect transistor as a component of the memory cell changes according to the amount of electrons in the floating gate in the memory cell. In a program state, the threshold voltage is high. In an erase state, the threshold voltage is low. Data is stored by using the phenomenon.

Further, data is read from a memory cell by applying a high voltage (e.g., 5 V) to the control gate; applying a low voltage (e.g., 1 V) to the drain; applying a low voltage (e.g., 0 V) to the source; amplifying the difference between memory cell currents according to different threshold voltages flowing in the bit lines by a sense amplifier; and determining "1" or "0" of data (in the case of binary data).

The reason why the voltage of the drain is set to be lower than that in the control gate in programming is to prevent as much as possible a parasitic weak programming voltage (soft program) from being applied to a memory cell to which data is not programmed. The soft program occurs since a plurality of memory cells are commonly connected to the same word line or the same bit line.

In order to program and erase data to/from a flash memory (hereinafter, the operations will be generically simply referred to as "rewrite") while maintaining high reliability as described above, very complicated control is required. Consequently, many semiconductor devices in each of which a recent flash memory is mounted have therein a control circuit called a state machine and realize automatic rewriting when seen from the user in order to improve usability of the user. For example, in flash memories disclosed in JP 8(1996)-64000 A, JP 11(1999)-86580 A, JP 2001-357684A and the like, a control is performed by using a control circuit called a state machine.

FIG. 7 shows a concrete configuration example of the flash memory. A memory array 24 is an array of memory cells having the configuration shown in FIG. 5. Word lines are connected to a row decoder 22, and bit lines are connected to a column decoder 23.

A booster circuit 30 operates in programming and erasing of data and generates a high voltage (e.g., 12 V) necessary for the operation. A program/erase voltage generation circuit 21 is a circuit for generating a high voltage necessary for a rewriting operation from the high voltage (e.g., 12 V) boosted by the booster circuit 30. For example, a high voltage (e.g., 7 V) to be applied to the drain of a memory cell in programming is generated by decreasing the voltage via a regulator circuit (not shown) in the program/erase voltage generation circuit 21. A voltage to be applied to the control gate of the memory cell in programming is supplied via the row decoder 22 and a word line from the program/erase voltage generation circuit 21. A voltage to be applied to the drain is supplied via the column decoder 23 and a bit line. A voltage to be applied to the source of the memory cell in erasing is supplied via a source voltage switching circuit (not shown) from the program/erase voltage generation circuit 21.

With respect to 5 V to be applied to the control gate of the memory cell in reading, when Vcc is lower than 5 V (e.g., 3.3 V), 5 V is generated by the booster circuit 30 and supplied via the row decoder (not shown).

A control circuit 41 controls, in a rewriting operation, the booster circuit 30, the program/erase voltage generation circuit 21, the row decoder 22, the column decoder 23, a sense amplifier 25, an input/output buffer 27, an address register 26, a reference voltage generation circuit 31, a read data register 28 and a program data register 29 via a control bus on the basis of a predetermined algorithm.

A general flash memory has two kinds of power sources: a power source necessary for all of operations (hereinafter, described as Vcc); and a power source necessary only in rewriting hereinafter, described as Vpp). In rewriting of a memory cell, the power source voltage Vpp is boosted by the booster circuit 30. In reading, for example, when Vcc is lower than 5 V, the power source voltage Vcc is boosted by the booster circuit 30.

A recent flash memory using only the power source voltage Vcc is also commercially available. In this case, the power source voltage Vcc is supplied to the booster circuit 30 and a desired voltage is generated from the power source voltage Vcc.

The flowchart of FIG. 11 shows an algorithm (procedure) of a programming operation of a flash memory. A case where the power source voltages Vcc and Vpp are provided will be described. When the programming operation starts, first, program data as an expectation value is input to the program data register 29 (#10). The booster circuit 30 and the program/erase voltage generation circuit 21 are sequentially enabled (operable) (#20, #30). The flash memory waits until the program/erase voltage generation circuit 21 becomes ready to output a desired voltage, and a voltage detection circuit 37 checks a voltage level which may be the power source voltage (Vpp), an output voltage of the booster circuit or an output voltage of the program/erase voltage generation circuit 21 (#40). In the case where the voltage level is lower than a desired reference voltage (e.g., Vpp is 2.7 V or less and an output voltage of the booster circuit is 8.5 V or less), a program voltage is not applied to a memory cell but a "program operation failure" state is set.

In the case where the voltage level has achieved a desired reference voltage, a program voltage is applied to the memory cell (#50). The program voltage is applied to, in the case of a binary memory cell, a memory cell corresponding to a bit of a data value "0" in program data. Generally, in the flash memory, the data value of the memory cell in an erase state is "1", so that it is unnecessary to program the program data "1" to a corresponding memory cell. For example, when program data length is 16 bits and program data is FFEEH (H indicates that FFEE is hexadecimal data), to be specific, in the case of "1111111111101110", data is programmed in the bit 0 (the least significant bit) and the bit 4 (the fifth bit from the bottom). In the case where the number of memory cells to which a program voltage can be applied simultaneously (hereinafter, simply referred to as the number of program bits) is two bits, program data is divided into eight pieces and a program voltage applying operation is repeated eight times (#50, #60). However, in the case where the divided program data in the 2-bit unit is "11", the program voltage is not applied to memory cells corresponding to the two bits. After completion of the program voltage application, a verifying operation (reading for verifying the program data) is performed (#70).

The data value of a memory cell is converted to data of "1" and "0" by the sense amplifier 25 and the data is stored into the read data register 28. The control circuit 41 compares the program data register 29 and the read data register 28 (#80). When a result of comparison is a mismatch, the program voltage is applied again to the memory cell of the mismatch (#90, #40, #50 . . . ). In the case where a match is not obtained in the verifying operation within the preset maximum number (e.g., 128) of application times, the program/erase voltage generation circuit 21 and the booster circuit 30 are disabled (inoperable) to finish the operation, and a "program operation failure" state is set (#90 to #110). In the case where a match is obtained in the verifying operation, the program/erase voltage generation circuit 21 and the booster circuit 30 are disabled (inoperable) to finish the operation, and a "program operation success" state is set (#120, #130).

FIG. 8 shows a configuration example of the booster circuit 30. The booster circuit 30 in FIG. 7 is the booster circuit 30 in FIG. 8. The booster circuit 30 is constructed by an oscillation circuit 36, a drive signal generation circuit 33, a pump cell circuit 34, a comparator 32 and a diode chain 35. The voltage is boosted by driving the pump cell circuit 34. A drive signal PCLK is generated by the drive signal generation circuit 33 on the basis of an output signal OSC of the oscillation circuit 36. To one of input terminals of the comparator 32, a voltage V12 obtained by decreasing an output V11 of the booster circuit 30 via the diode chain 35 is input. To the other input terminal of the comparator 32, a voltage V13 generated by the reference voltage generation circuit 31 is input. The reference voltage generation circuit 31 outputs a constant voltage without being hardly influenced by the power source voltage, temperature and manufacturing variations. The voltage value of the voltage V12 is connected to the diode chain 35 so as to be equal to the voltage V13 when the booster circuit 30 outputs a desired voltage (e.g., 12 V). For example, when the output voltage of the reference voltage generation circuit 31 is 2 V, it is sufficient to set six diodes in the diode change 35 and connect the voltage between the first and second diodes from the ground (ground potential) side. The voltage V12 is a voltage of ⅙ of the voltage V11, that is, 2 V. The comparator 32 compares the voltage values of the voltages V12 and V13 and outputs a bias signal BIAS for adjusting the oscillation frequency of the oscillation circuit 36. The oscillation frequency decreases as the output voltage V11 of the booster circuit 30 increases.

The configuration of an IC module mounted on a non-contact IC card will now be described. The non-contact IC card is widely used for a lift ticket in a skiing area and a tag for cloth and, recently, also used for a commutation ticket of a public institution and the like. FIG. 6 shows the configuration of an IC module mounted on a typical non-contact IC card. Internal blocks of an LSI for an IC card are a CPU core 40, a non-contact interface 10 and an antenna 15. The non-contact interface 10 is constructed by a rectification circuit 11, a modulation circuit 12, a demodulation circuit 13, a clock separating circuit 14, and regulators 16 and 17. The CPU core 40 has a configuration almost the same as that of a normal microcomputer and includes the control circuit 41, a ROM 42, a RAM 43 and a flash macro 20. A program is stored in the ROM 42, and the RAM 43 is used as a working memory during arithmetic operation. The flash macro 20 is used for storing a program or holding data and has a configuration as shown in FIG. 7.

An access from the outside is made by a signal obtained by converting an electromagnetic wave input/output via the antenna 15. An access to the memory is made by a program. A general LSI for an IC card has a one-chip configuration, so that the memory cannot be directly accessed from the outside. Therefore, an illegal access to the memory can be controlled by software and the high confidentiality of information in the memory can be realized.

A basic operation of the IC module mounted on the non-contact IC card will now be described. First, a control signal of the non-contact IC card is converted by an external reader/writer (not shown) into an electromagnetic wave and the resultant signal is supplied. When the control signal converted to the electromagnetic wave is received by the non-contact IC card, electromagnetic induction occurs by the antenna 15 buried in the non-contact IC card. A signal generated by the electromagnetic induction is converted to supply power, a clock signal and a control signal for operating the CPU core 40. The signal generated by the electromagnetic induction is converted to a positive voltage via the rectification circuit 11 and smoothed via the regulator 16 (which generates Vpp) and the regulator 17 (which generates Vcc). The resultant voltage is supplied as a power source to the CPU core 40. The power source voltage (Vcc and Vpp) of a general IC module is 5 V or 3.3 V The signal generated by the electromagnetic induction is converted to an internal clock by the clock separating circuit 14. The frequency of the internal clock is about 1 MHz to 5 MHz. Further, the signal generated by the electromagnetic induction is supplied to the control circuit 41 in the CPU core 40 via the demodulation circuit 13. By the signal supplied to the control circuit 41, the ROM 42, RAM 43 and flash macro 20 are controlled and a process such as an arithmetic operation is performed. A result of computation in the CPU macro core is converted to an AC signal having a predetermined bandwidth by the modulation circuit 12, and an electromagnetic wave is output from the antenna 15. The external reader/writer receives the electromagnetic wave, converts it to a signal via the demodulation circuit in the reader/writer, and completes transmission/reception of information to/from the IC card.

In the non-contact operation, however, under a condition that makes the magnetic field intensity low such as a long distance between the IC module and the reader/writer, the current supply capability deteriorates. Consequently, when an operation requiring a large current consumption is performed (e.g., a rewriting operation of the flash memory), even if the power source voltage reaches a desired voltage on start of the operation, a drop in the power source is caused by the current consumption in the programming operation of the regulators 16 and 17. There is a case where the high voltage generated by the booster circuit 30 cannot achieve a desired voltage level and the programming operation fails. As described above, the conventional nonvolatile semiconductor memory device having the booster circuit has a problem in that, when the current supply capability of the power source voltage drops in rewriting, the rewriting operation fails.

SUMMARY OF THE INVENTION

The present invention has been achieved in consideration of the above-described problems and its first object is to provide a nonvolatile semiconductor memory device having a storage region constructed by a plurality of electrically rewritable nonvolatile memory cells and a booster circuit for boosting a power source voltage to thereby generate a voltage necessary to rewrite the storage region, wherein the power source voltage can be prevented from being decreased in the device and data in the storage region can be stably rewritten.

A second object of the present invention is to provide an IC card having the nonvolatile semiconductor memory device, wherein data can be stably rewritten in the storage region even in the case where the power supply capability from the outside is restricted.

A nonvolatile semiconductor memory device according to the present invention for achieving the object includes a storage region constructed by a plurality of electrically rewritable nonvolatile memory cells, and a booster circuit for boosting a power source voltage to thereby generate a voltage necessary to rewrite the storage region. The nonvolatile semiconductor memory device includes a voltage determining part for determining a voltage level of a predetermined node in the semiconductor memory device in rewriting of the storage region, and a rewrite unit determining part for determining the number of bits of input data to be rewritten at once on the basis of a result of determination of the voltage determining part. Further, the voltage determining part includes a voltage dividing circuit for dividing a voltage at the predetermined node, a reference voltage generation circuit for outputting a reference voltage which is a constant voltage, and a comparator for comparing the reference voltage output from the reference voltage generation circuit with an output voltage of the voltage dividing circuit.

In this case, the number of bits of the input data to be rewritten at once is the predetermined minimum unit. When the voltage level of the predetermined node does not achieve a desired reference voltage, preferably, rewriting of the storage region with the data is inhibited.

An IC card according to the present invention for achieving the object includes the nonvolatile semiconductor memory device having the above-described characteristics. In the case where the IC card is a non-contact IC card performing power supply and signal communication in a non-contact manner, or in the case where the IC card is a contact/non-contact type combination IC card capable of executing power supply and signal communication in a non-contact manner and having a contact terminal for the power supply and the signal communication, more preferably, the IC card has the nonvolatile semiconductor memory device having the above-described characteristics.

Further, when the IC card is a combination IC card, it is preferable to switch a control method in rewriting of the storage region in the nonvolatile semiconductor memory device in accordance with a method of executing the power supply and the signal communication, which is either of the non-contact type or the contact type.

DETAILED DESCRIPTION OF THE INVENTION

Figure 7:
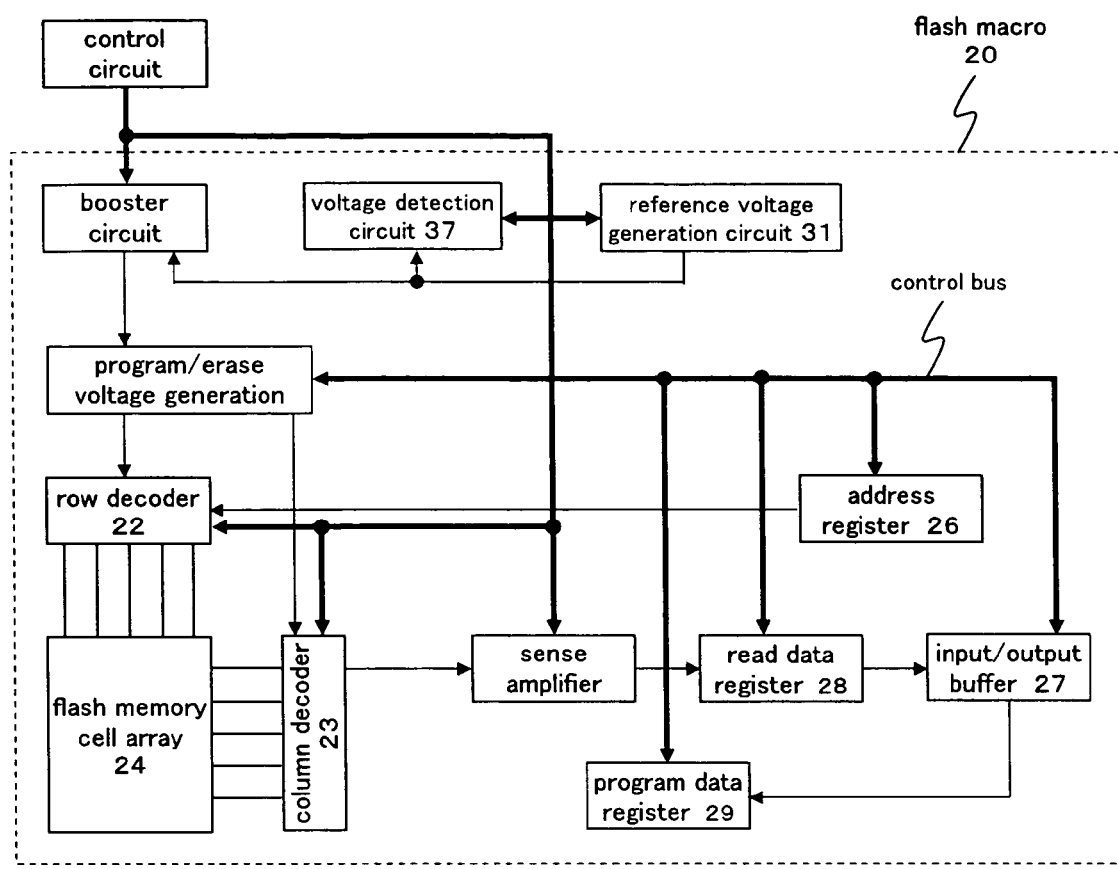
FIG. 7 is a block diagram showing an example of a conventional nonvolatile semiconductor memory device.

Embodiments of a nonvolatile semiconductor memory device according to the present invention (hereinafter, appropriately referred to as "the inventive device") and an IC card according to the present invention having the inventive device will be described below with reference to the drawings. Circuits, circuit elements, signals and the like common to those of the conventional flash memory shown in FIG. 7 are given common reference numerals.

First Embodiment

Figure 1:
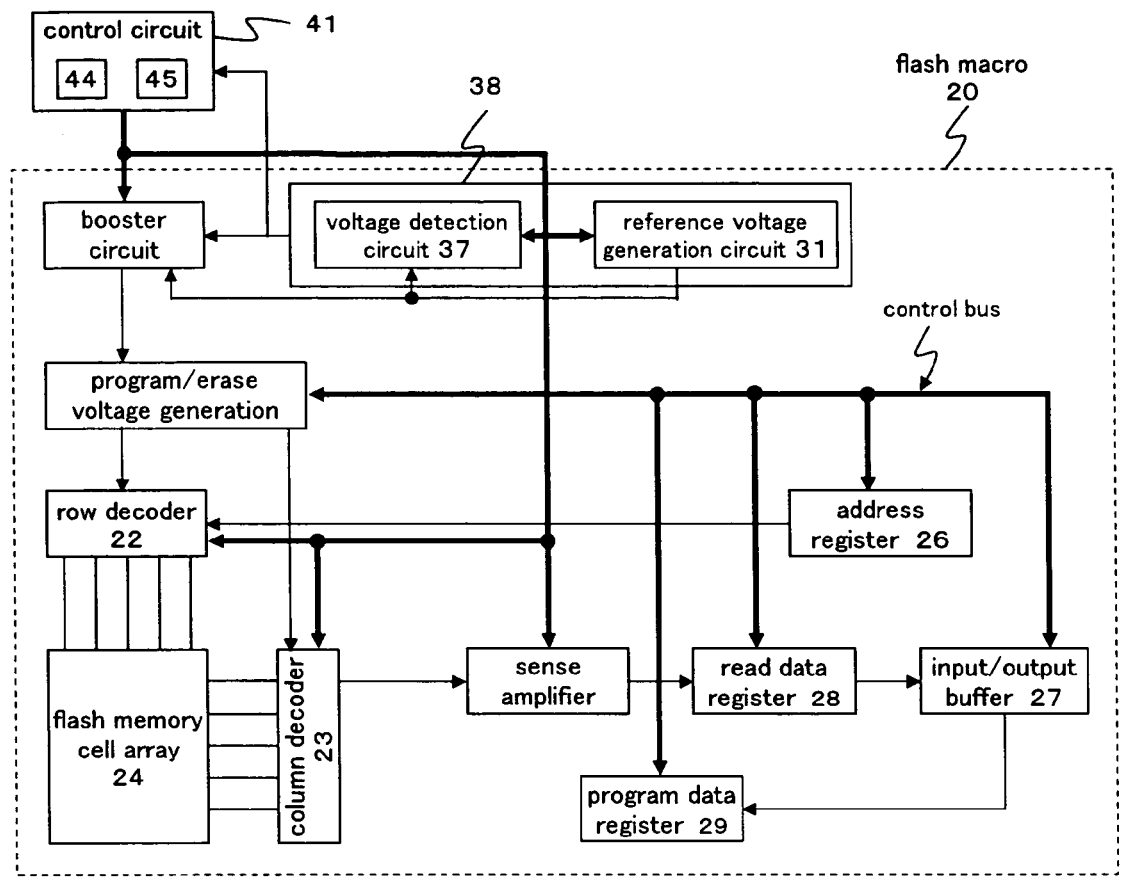
FIG. 1 is a block diagram showing a first embodiment of a nonvolatile semiconductor memory device according to the present invention.
Figure 4:
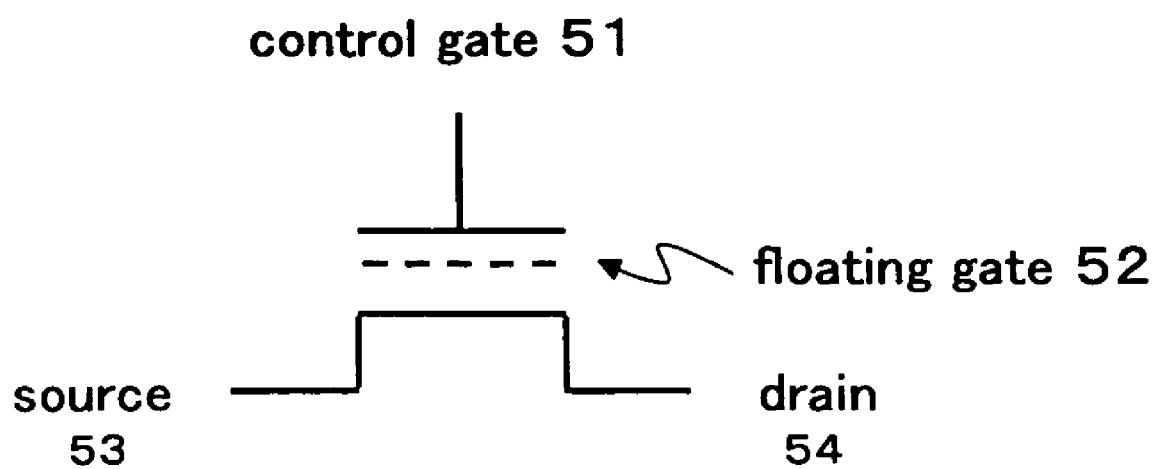
FIG. 4 is an equivalent circuit diagram illustrating the structure of a flash memory cell.
Figure 5:
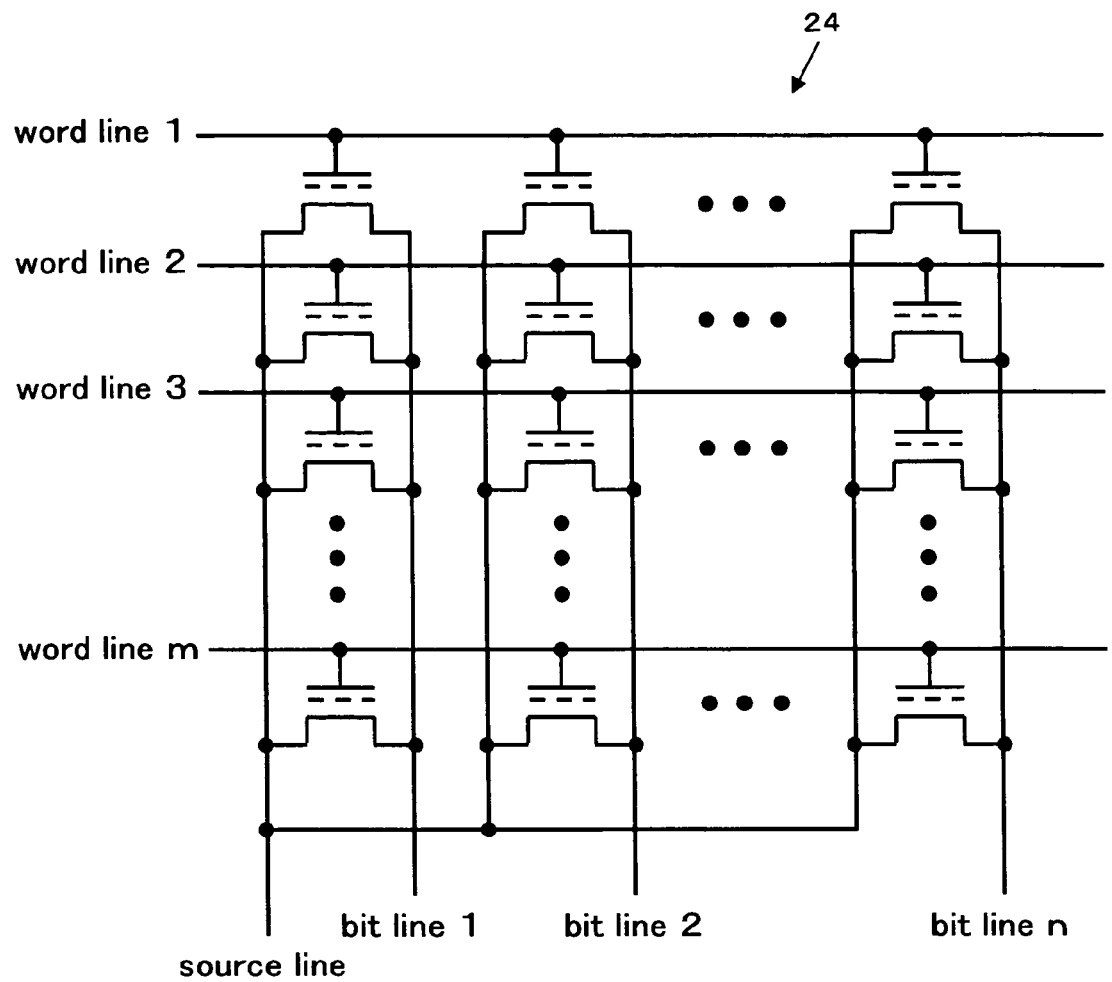
FIG. 5 is a circuit diagram illustrating the structure of a flash memory cell array.
Figure 6:
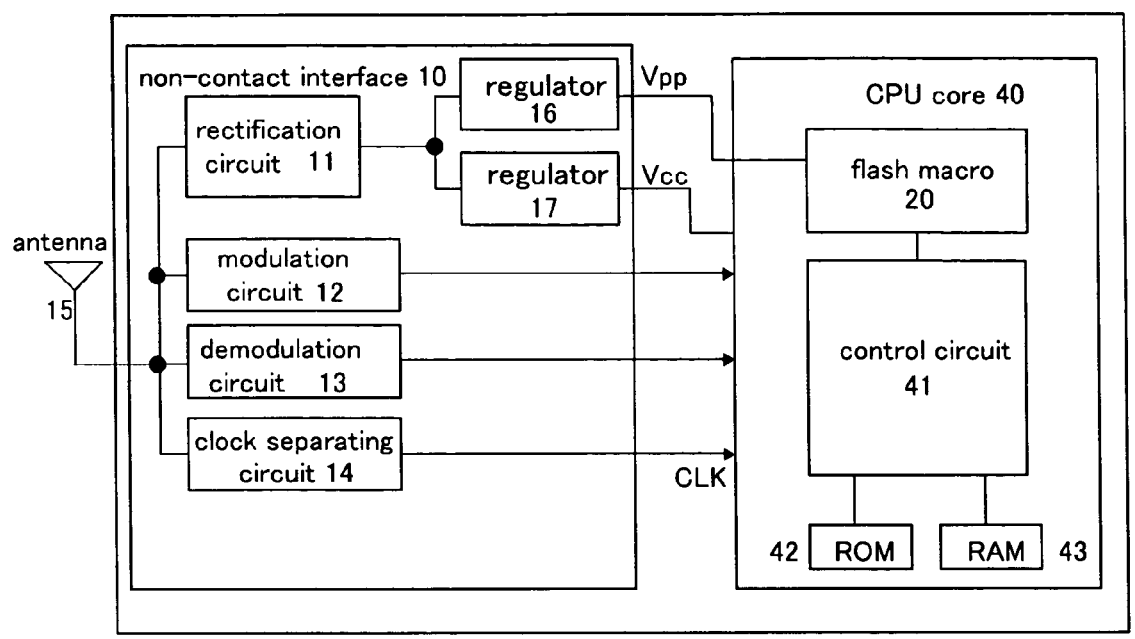
FIG. 6 is a block diagram showing an example of the configuration of an IC module.

As shown in FIG. 1, the inventive device has the flash macro 20 and the control circuit 41 for controlling programming and erasing of data to/from the flash memory cell array 24 as a storage region constructed by a plurality of nonvolatile electrically rewritable memory cells of the flash macro 20. The flash macro 20 has, as shown in FIG. 1, the booster circuit 30, flash memory cell array 24, program/erase voltage generation circuit 21, row decoder 22, column decoder 23, sense amplifier 25, input/output buffer 27, address register 26, read data register 28, program data register 29, reference voltage generation circuit 31 and voltage detection circuit 37. The flash memory cell array 24 is obtained by arranging flash memory cells shown in FIG. 4 in an array and has an array configuration as shown in FIG. 5. Concretely, the control circuit 41 is constructed in a hardware manner by a state machine which sequentially processes programming and erasing of data to/from the flash memory cell array 24 in accordance with a predetermined algorithm. Alternatively, the control circuit 41 may be constructed in a software manner by a so-called small microprocessor of a stored program method.

The configuration and operation of the inventive device will be described with respect to the case where the storage region of the inventive device is constructed by the flash memory cell array 24.

The concrete difference between the inventive device and the conventional nonvolatile semiconductor memory device shown in FIG. 7 is that a voltage determining part 38 constructed by the reference voltage generation circuit 31 and the voltage detection circuit 37 determines the voltage level of a predetermined node in the inventive device in rewriting of data (concretely, programming and erasing of data) of the flash memory cell array 24. On the basis of the result of determination of the voltage level of the voltage determining part 38, a rewrite unit determining part 44 and a batch rewriting determining part 45 provided in the control circuit 41 determine the number of memory cells to which data is programmed simultaneously at the time of programming data and, also, determine whether a block size of the flash memory cell array 24 for erasing data simultaneously at the time of erasing data can be erased simultaneously or not. The booster circuit 30 is also different from that in the conventional nonvolatile semiconductor memory device with respect to the point that the current supply capability is variable on the basis of a result of determination of the voltage level of the voltage determining part 38. The case of the power source voltage for programming and the power source voltage for erasing as an example of the voltage level of a predetermined node will be described below.

Figure 2:
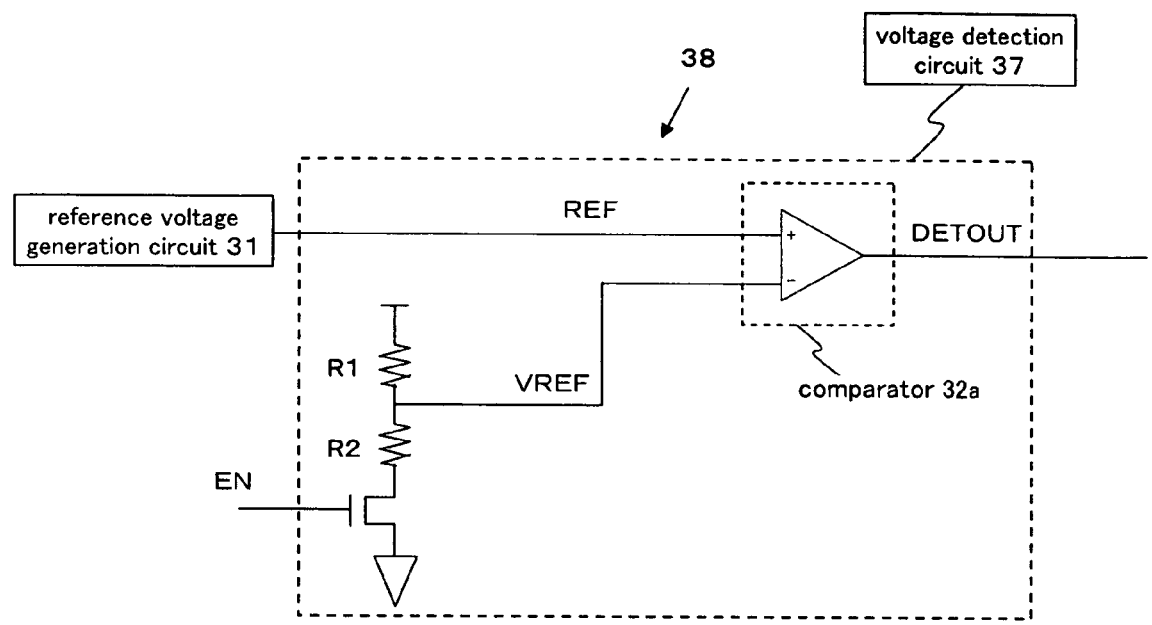
FIG. 2 is a circuit diagram showing a voltage determining part of the nonvolatile semiconductor memory device according to the present invention.

As shown in FIG. 2, the voltage determining part 38 is constructed by the reference voltage generation circuit 31 and the voltage detection circuit 37. A signal EN in FIG. 2 is a start signal of the voltage detection circuit 37. The voltage detection circuit 37 is enabled (operable) at the high level (such as Vcc) and is disabled (inoperable) at the low level (such as ground potential). The voltage detection circuit 37 is enabled in the programming and erasing operations. Although it is desirable to disable the voltage detection circuit 37 in the other operation for the purpose of current consumption reduction, it is not limited. The voltage detection circuit 37 may be disabled as necessary. In the disable state, in order to reduce the current consumption of the voltage detection circuit 37 as much as possible, particularly, a feed-through current is prevented from flowing to resistors R1 and R2. A signal REF is an output of the reference voltage generation circuit 31. As the signal REF, a constant voltage (e.g., 2 V) is output in the programming/erasing operations. VREF is a signal generated by decreasing the power source voltage Vpp for programming and erasing. In the first embodiment, a voltage decreasing circuit is constructed by the resistors R1 and R2. The resistance ratio between the resistor R1 and the resistor R2 is determined so that, when the operation lower limit value voltage of the power source voltage Vpp is, for example, 2.7 V, VREF becomes 2 V The resistance value is set to a value to a degree that the current supply capability of the power source voltage Vpp does not decrease (e.g., the current flowing in the resistors R1 and R2 is set to several µA). In the first embodiment, the voltage is divided by using resistors as a method of decreasing the voltage. However, the voltage may be divided by another method such as a method using a diode. The outputs REF and VREF of the reference voltage generation circuit 31 are input to a comparator 32a. When the power source voltage Vpp becomes 2.7 V or less, VREF becomes smaller than REF, and the comparator 32a outputs a low-level signal DETOUT. When the power source voltage Vpp is 2.7 V or more, VREF becomes larger than REF and the comparator 32a outputs a high-level signal DETOUT. The output signal DETOUT of the comparator 32a is used as a signal for determining the voltage level of a predetermined node in step #40 of the flowchart of the programming operation in FIG. 9 which will be described later. It is sufficient to check the number of program bits by determining that the power source voltage Vpp has not achieve a desired voltage when the output signal DETOUT is at the low level.

Figure 3:
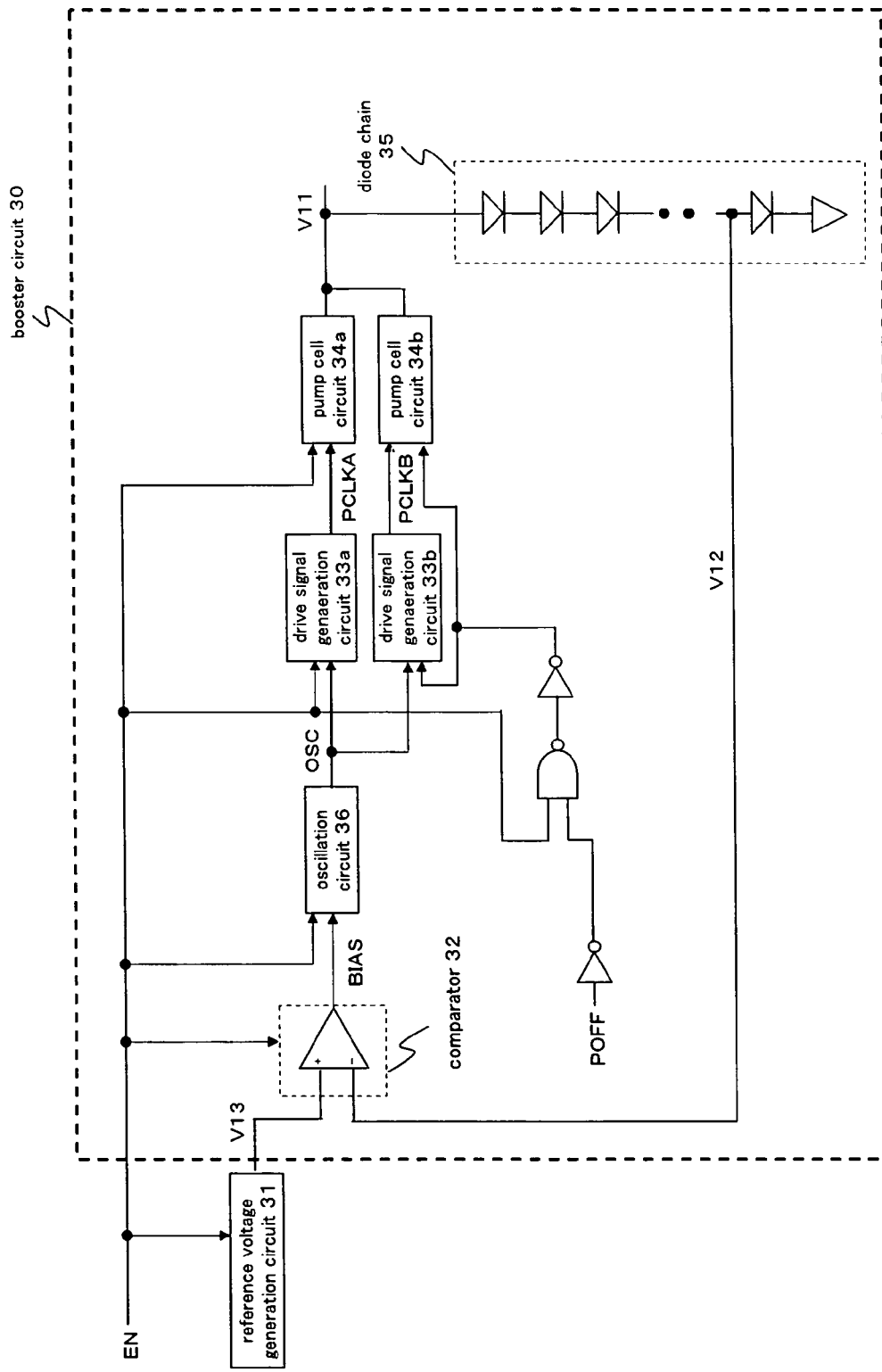
FIG. 3 is a circuit diagram showing a booster circuit of the nonvolatile semiconductor memory device according to the present invention.

FIG. 3 shows the booster circuit 30 of the inventive device. The booster circuit 30 operates in programming and erasing of data and generates a high voltage necessary for the operations (e.g., 12 V). As shown in FIG. 3, the booster circuit 30 is constructed by the comparator 32, the oscillation circuit 36, two drive signal generation circuits 33a and 33b, two pump cell circuits 34a and 34b, the diode chain 35, and other logic circuits.

The operation of programming data to the storage region in the inventive device will now be described with respect to the case where the program data length is 16 bits and the number of program bits is the power of 2.

Figure 9:
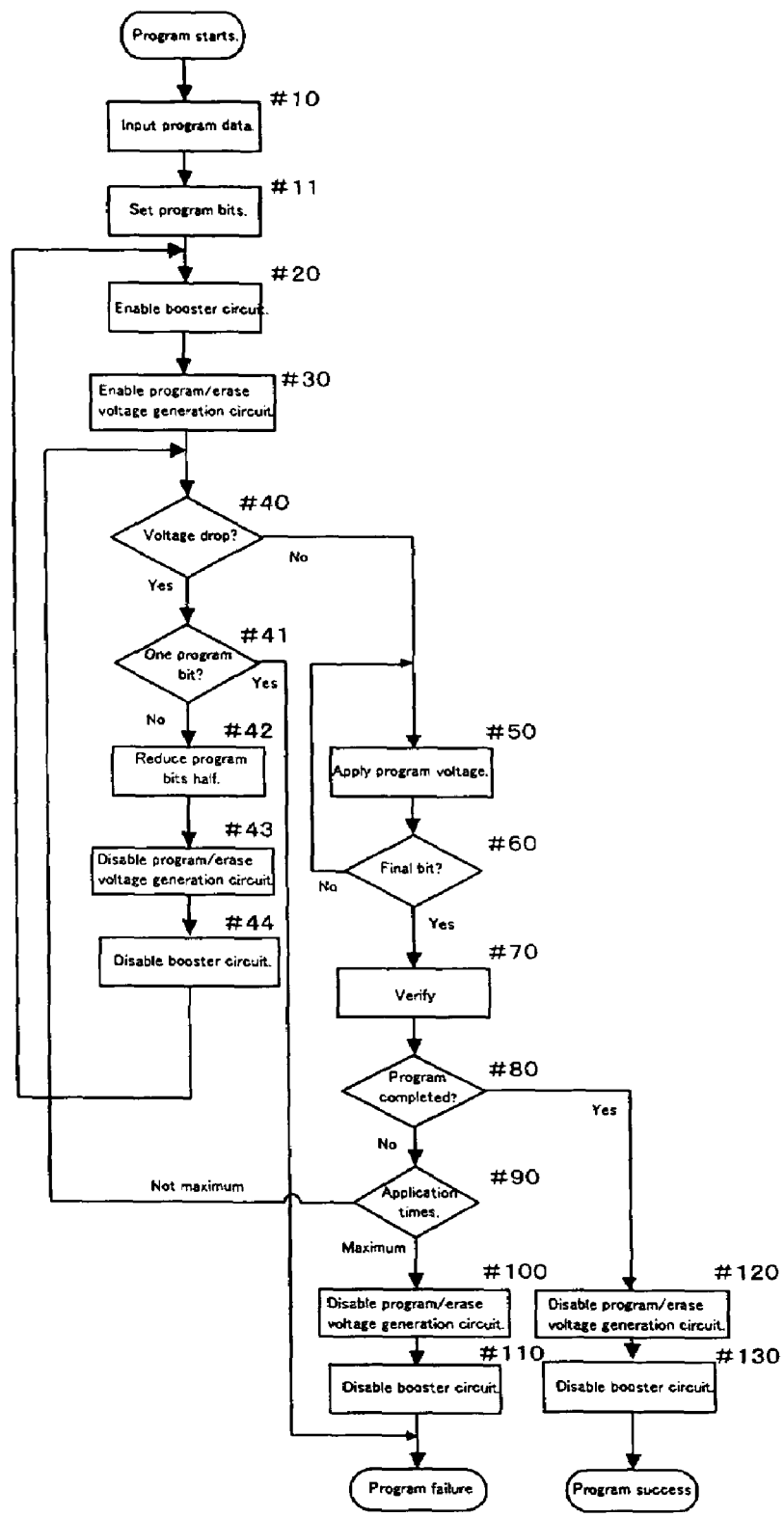
FIG. 9 is a flowchart showing a programming operation in the first embodiment of the nonvolatile semiconductor memory device according to the present invention.

FIG. 9 shows a procedure of the control circuit 41 and the rewrite unit determining part 44 in the operation of programming data to the storage region in the inventive device. When a programming operation starts, first, program data as an expectation value is input to the program data register 29 (#10) and an initial setting of the number of program bits to be simultaneously programmed (in the case of a binary cell, the number of program bits is the same as the program data length) is made (#11). For example, the number of program bits is set to 2 bits. Subsequently, the booster circuit 30 and the program/erase voltage generation circuit 21 are sequentially enabled (#20, #30). The flash memory waits until the program/erase voltage generation circuit 21 becomes ready to output a desired voltage, and the voltage detection circuit 37 checks the power source voltage Vpp (#40). When the voltage level of the power source voltage Vpp is lower than a desired voltage value (e.g., 2.7 V), the number of program bits is checked (#41). When the number of program bits is not 1, the number of program bits is reduced to the half (#42), and the predetermined operation is performed again from the start-up of the booster circuit 30 (#43, #44, #20 to #41). The operation is repeated until the number of program bits becomes 1. For example, in the case where the initial value of the number of program bits is 2, the number of program bits is set to 1, and the voltage level is determined again. When the number of program bits is 1 and the voltage level is lower than the desired voltage value (2.7 V), a "program operation failure" state is set and the program voltage is not applied to the memory cell.

In step #42 of the flowchart of the programming operation shown in FIG. 9, in association with the reduction of the number of program bits to the half, the corresponding drive signal generation circuit 33b and the pump cell circuit 34b are disabled. FIG. 3 shows a configuration example of the case where the initial value of the number of program bits is 2 (#11). When the number of program bits becomes the half which is "1", a signal POFF becomes the high level, the drive signal generation circuit 33b and the pump cell circuit 34b are disabled, and the current supply capability of the booster circuit 30 becomes the half. The power consumption of the booster circuit 30 is mostly made by the drive signal generation circuits 33a and 33b for driving capacitors in the pump cell circuits 34a and 34b (about 80 to 85% of the current consumption of the power source voltage Vpp). Therefore, the power consumption in rewriting of the electrically rewritable nonvolatile storage region can be reduced by about 42.5% at the maximum.

When the current consumption is within the current supply capability of the power source voltage Vpp, without causing a drop in the power source voltage Vpp, rewriting of the nonvolatile storage region can be performed.

Figure 8:
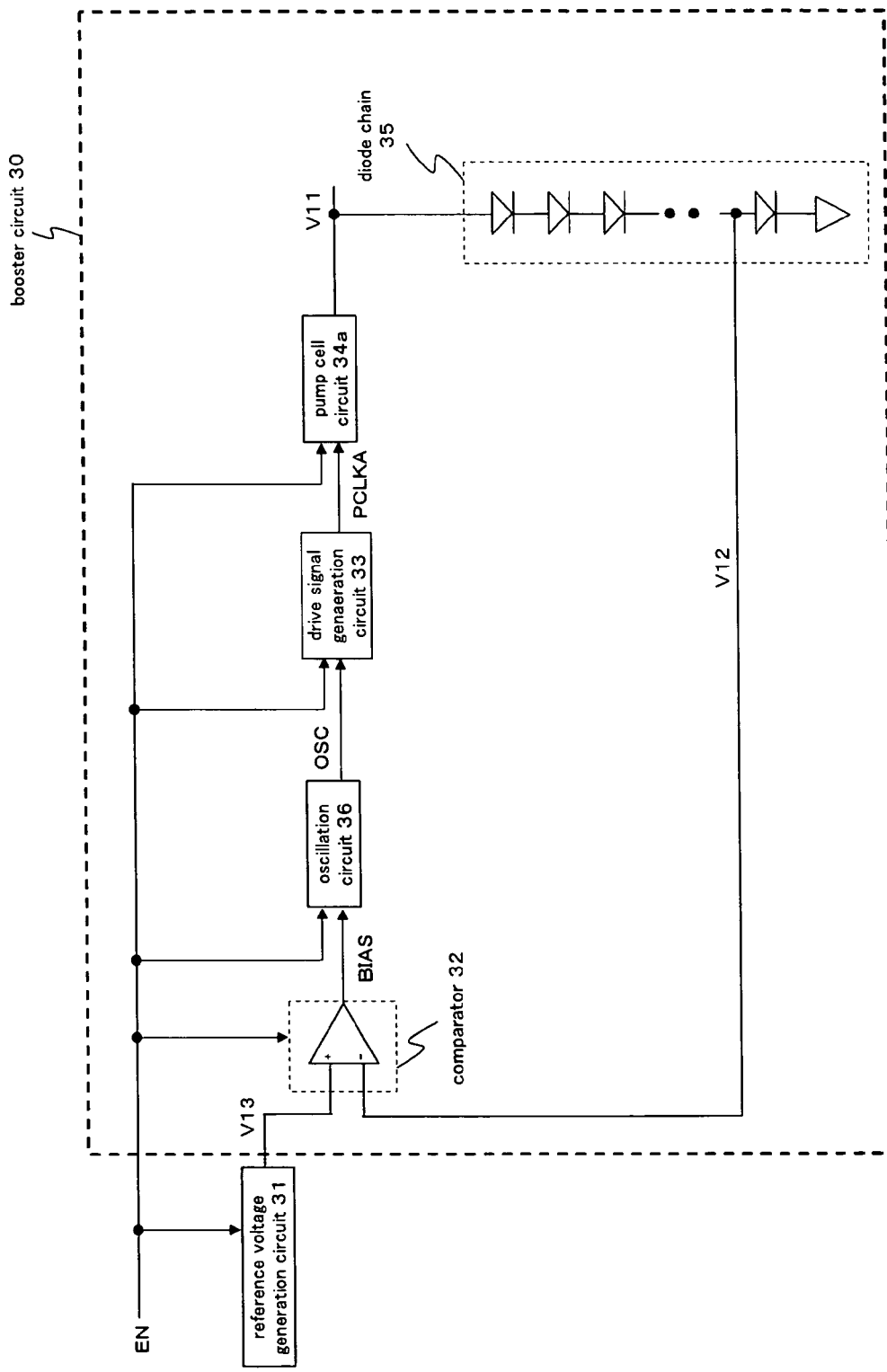
FIG. 8 is a circuit diagram showing an example of a booster circuit of the conventional nonvolatile semiconductor memory device.

It is sufficient to determine controls on the drive signal generation circuits 33a and 33b and the pump cell circuits 34a and 34b in the booster circuit 30 in accordance with the maximum number of program bits. Specifically, the circuit configuration is employed such that, when the number of program bits is four bits, the current supply capability and the power consumption of the drive signal generation circuit 33 and the pump cell circuit 34 in the booster circuit 30 can be set to $\frac{1}{1}$, $\frac{1}{2}$ and $\frac{1}{4}$. The basic boosting operation of the booster circuit 30 is similar to that of the conventional booster circuit 30 shown in FIG. 8.

Figure 11:
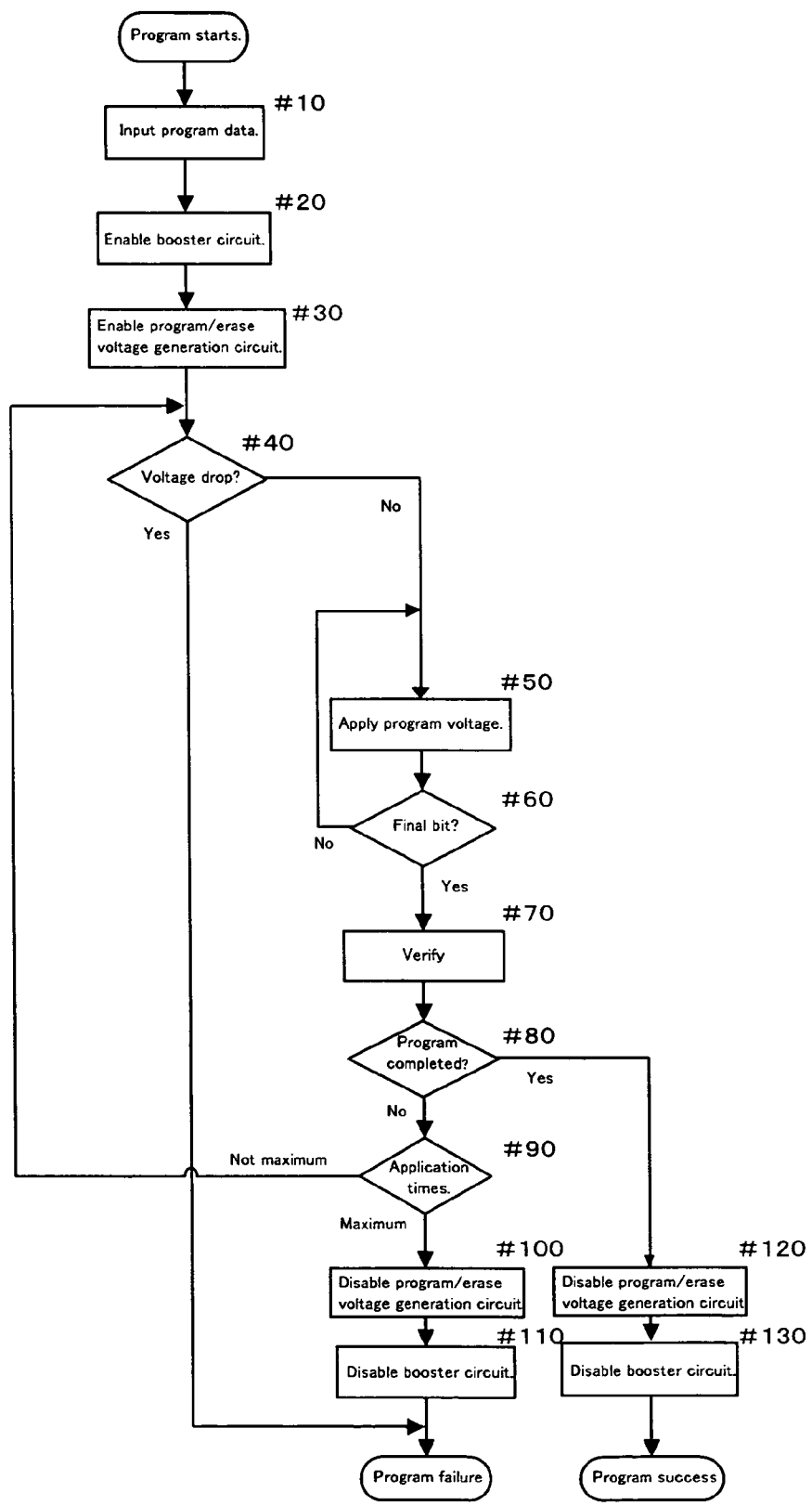
FIG. 11 is a flowchart showing the programming operation in the conventional nonvolatile semiconductor memory device.

In step #40 of the flowchart of FIG. 9, when the voltage level is higher than the desired voltage value, the program voltage is applied to the memory cell (#50). When the program data length is 16 bits and the number of program bits is two bits, program data is divided into eight pieces and the programming operation (application of the program voltage to the memory cell) is executed eight times. When the number of program bits is one bit, the program data is divided into 16 pieces and the programming operation is performed 16 times. The following operations (#50 to #130) are similar to the programming operations of the conventional nonvolatile semiconductor memory device shown in FIG. 11.

The reason why the number of program bits is set to the power of 2 (2 bits in the first embodiment) in step #11 is that the data length is generally the power of 2 such as 8 bits and 16 bits. When the number of program bits is reduced to the half, by repeating the operation of applying a voltage to the memory cell twice, the operation performed before the number of program bits is reduced to the half can be realized, so that program data is handled very easily.

However, the present invention is not limited to the method of setting the number of program bits to the power of 2 and reducing the number of program bits to the half. It is also possible to prepare a plurality of VREF voltage levels and set the predetermined number of program bits on the basis of the plurality of results of determination.

Although the case of the power source voltage Vpp for programming/erasing has been described as an example of the voltage level of a predetermined node, in the case of the flash memory in which the power source voltage is only Vcc, Vcc may be used.

Second Embodiment

Figure 10:
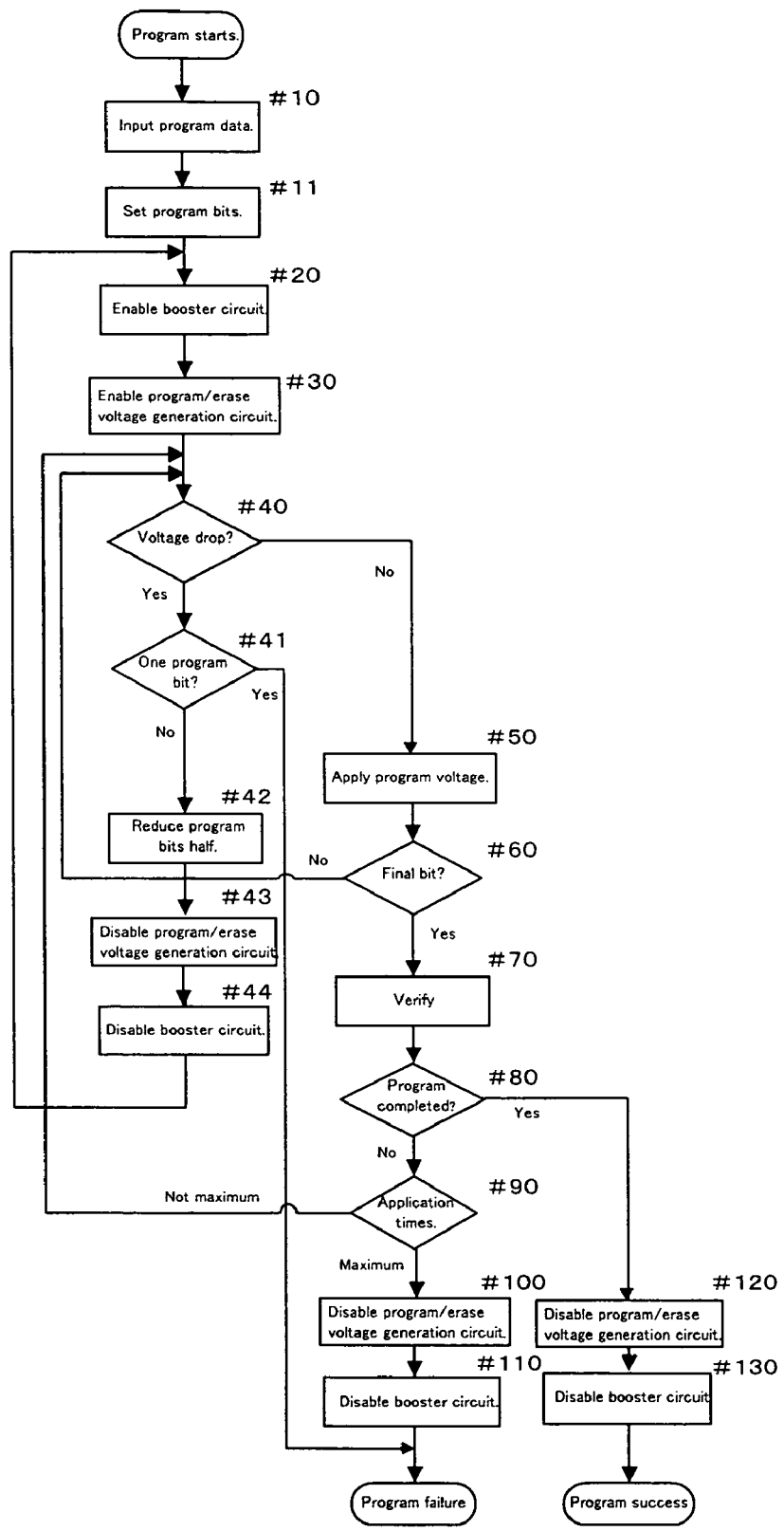
FIG. 10 is a flowchart showing a programming operation in a second embodiment of a nonvolatile semiconductor memory device according to the present invention.

As a second embodiment, a case of setting the number of program bits for each application of the program voltage will be described. FIG. 10 shows the procedure of the control circuit 41 and the rewrite unit determining part 44 in the operation of programming data to the storage region in the inventive device.

In the second embodiment, program data is divided. Each time a program voltage is applied (#50, #60), the voltage level is determined (#40). When the determined voltage level has not achieved the desired voltage, the number of program bits is changed (#42). When the final bit is not detected in step #60, that is, when program data still remains, the voltage level is checked again. Consequently, the program voltage can be stably applied to the memory cell, and the following verifying operation (#70) can be performed more successfully. The other operations are similar to those of the first embodiment.

Third Embodiment

A third embodiment of the inventive device will now be described. In the first and second embodiments, the voltage detection circuit 37 checks the voltage level of the power source voltage Vpp, concretely, the voltage level obtained by decreasing the power source voltage Vpp. In the third embodiment, the voltage detection circuit 37 may check the voltage level of the output voltage V11 of the booster circuit 30, concretely, the voltage level of the output voltage obtained by decreasing the output voltage V11.

VREF in FIG. 2 is the voltage level generated by decreasing the output voltage V11 of the booster circuit 30. The circuit configuration of the voltage detection circuit 37 itself is the same as that in the first embodiment. The third embodiment is different from the first embodiment with respect to the point that the voltage to be used is changed from the power source voltage Vpp to the output voltage V11 of the booster circuit 30 and the resistance ratio between the resistors R1 and R2 is adjusted in accordance with the voltage level of the output voltage V11. For example, the resistance ratio between the resistors R1 and R2 is determined so that VREF becomes 2 V when the lower limit operation voltage level of the output voltage V11 is 8.5 V. The resistance values of the resistors R1 and R2 are set to values at which the current supply capability of the booster circuit 30 does not decrease. For example, the current flowing in the resistors R1 and R2 is set to several μA.

In the third embodiment, the resistors are used as a method of decreasing the voltage. The voltage may be decreased by another method such as a method using a diode. The outputs REF and VREF of the reference voltage generation circuit 31 are input to the comparator 32a. When the output voltage V11 of the booster circuit 30 becomes 8.5 V or less, VREF becomes smaller than REF, and the comparator 32a outputs a low-level signal DETOUT. When the output voltage V11 of the booster circuit 30 is 8.5 V or more, VREF becomes larger than REF and the comparator 32a outputs a high-level signal DETOUT. The output signal DETOUT of the comparator 32a is used as a signal for determining the voltage level of a predetermined node in step #40 of the flowchart of the programming operation in FIG. 9. The other operations are similar to those of the first embodiment.

Fourth Embodiment

A fourth embodiment of the inventive device will now be described. In the first and second embodiments, the voltage detection circuit 37 checks the voltage level of the power source voltage Vpp, concretely, the voltage level obtained by decreasing the power source voltage Vpp. In the fourth embodiment, the voltage detection circuit 37 may check the output voltage of the program/erase voltage generation circuit 21, concretely, the voltage level of an output voltage obtained by decreasing the output voltage.

VREF in FIG. 2 is the voltage level generated by decreasing the output voltage of the program/erase voltage generation circuit 21. The circuit configuration of the voltage detection circuit 37 itself is the same as that in the first embodiment. The fourth embodiment is different from the first embodiment with respect to the point that the voltage to be used is changed from the power source voltage Vpp to the output voltage of the program/erase voltage generation circuit 21 and the resistance ratio between the resistors R1 and R2 is adjusted in accordance with the voltage level of the output voltage. For example, the resistance ratio between the resistors R1 and R2 is determined so that VREF becomes 2 V when the lower limit operation voltage level of the output voltage is 8.5 V. The resistance values of the resistors R1 and R2 are set to values at which the current supply capability of the booster circuit 30 does not decrease. For example, the current flowing in the resistors R1 and R2 is set to several μA.

In the fourth embodiment, the resistors are used as a method of decreasing the voltage. The voltage may be decreased by another method such as a method using a diode. The outputs REF and VREF of the reference voltage generation circuit 31 are input to the comparator 32a. When the output voltage of the program/erase voltage generation circuit 21 becomes 8.5 V or less, VREF becomes smaller than REF, and the comparator 32a outputs a low-level signal DETOUT. When the output voltage of the program/erase voltage generation circuit 21 is 8.5 V or more, VREF becomes larger than REF and the comparator 32a outputs a high-level signal DETOUT. The output signal DETOUT of the comparator 32a is used as a signal for determining the voltage level of a predetermined node in step #40 of the flowchart of the programming operation in FIG. 9. The other operations are similar to those of the first embodiment.

Fifth Embodiment

As a fifth embodiment, a case where the batch rewriting determining part 45 provided in the control circuit 41 sets a rewriting range of the flash memory cell array 24 as a storage region in accordance with the power supply capability of the power source voltage Vpp will be described. In the fifth embodiment, different from the first to fourth embodiments, rewriting is an operation of erasing data.

As recent flash memories, not only flash memories of an uniform block type in which all of block sizes as an erase unit are the same but also a number of flash memories of a boot block type in which block sizes are different from each other are produced. For example, in a boot-block type 8-megabit flash memory, the flash memory cell array 24 as a storage region is constructed by 15 pieces of 512-kilobit blocks (hereinafter, simply referred to as main blocks) and eight pieces of 64-kilobit blocks hereinafter, simply referred to as boot blocks).

In the erasing operation, a voltage is applied simultaneously to the sources of all of memory cells in one block. Therefore, in the case of charging the sources of memory cells to a desired voltage (e.g., 12 V), the smaller the block size is, the lighter the load is and the smaller the current to be supplied by the booster circuit is. In the erasing operation, when the output DETOUT of the voltage detection circuit 37 shown in FIG. 2 is at the low level, it is sufficient to check the value of the address register 26 in FIG. 1, if the block is a boot block, set the signal POFF to the high level, disable the drive signal generation circuit 33b and the pump cell circuit 34b, and check the voltage level again.

When the output DETOUT of the voltage detection circuit 37 is at the low level and the value of the address register 26 indicates a main block, an "erasing operation failure" state is determined, and the erase voltage is not applied to the source of the memory cell. The basic erasing operation of the flash memory is similar to that of the conventional nonvolatile semiconductor memory device. The basic operation of the booster circuit 30 in FIG. 1 is similar to that of the conventional nonvolatile semiconductor memory device.

Sixth Embodiment

Figure 12:
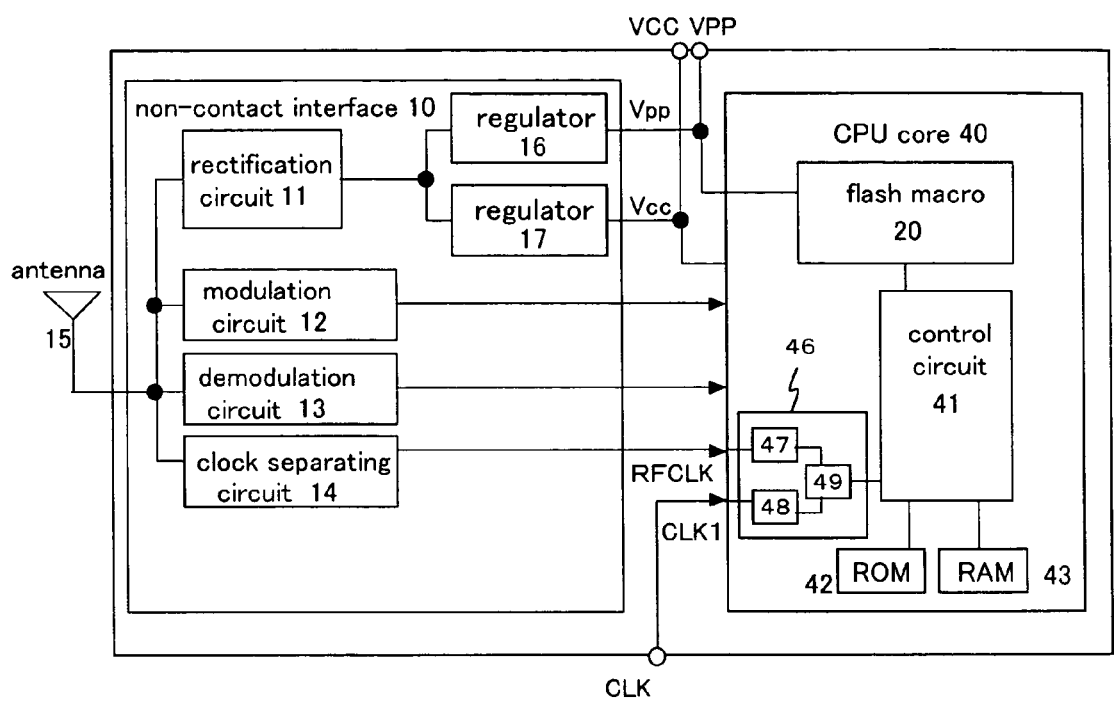
FIG. 12 is a block diagram showing the configuration in a sixth embodiment of a combination IC card having the nonvolatile semiconductor memory device according to the present invention.

As a sixth embodiment, an IC card according to the present invention having the inventive device will be described with reference to FIG. 12. A case where the IC card is a contact/non-contact combination IC card capable of executing supply of power and signal communication in a non-contact manner and having a contact terminal for the power supply and the signal communication, and a contact operation and a non-contact operation are discriminated from each other in accordance with the frequency of a clock CLK1 for contact-type communication input from an external clock terminal CLK and the frequency of a clock RFCLK for non-contact type communication received by the antenna coil 15, and the number of program bits is separately set will be described.

The contact operation is mainly used for a card of a financial institution such as a bank card, and the frequency of the clock for contact-type communication input to the external clock terminal CLK is 3.5 MHz or 4.9 MHz. On the other hand, the non-contact operation is used for a card of a transportation system such as a train or a bus, and the frequency of the clock for non-contact type communication is 13.56 MHz. Each of the frequencies is standardized as the communication interface in IC cards and is often used.

In the sixth embodiment, a circuit 46 for detecting the frequency of the clock CLK1 for contact-type communication input to the external clock terminal CLK and the frequency of the clock RFCLK for non-contact type communication received by the antenna coil is provided to determine the contact operation and the non-contact operation. Concretely, the clock CLK1 for contact-type communication and the clock RFCLK for non-contact type communication are counted by a counter 47 for contact-type communication and a counter 48 for non-contact-type communication, respectively. The counter which overflows first is held as switching means by an RS flip flop 49. In such a manner, according to the frequency of the clock CLK1 for contact-type communication and the frequency of the clock RFCLK for non-contact communication, either the contact-type communication or the non-contact type communication can be determined. The control circuit 41 can determine that the mode is the contact mode or the non-contact mode in accordance with the value of the RS flip flop 49.

The number of program bits can be separately set in the contact mode and the non-contact mode. For example, in the contact mode, the stable powers as Vcc and Vpp are supplied from an external power source terminal, so that the number of program bits is set to four bits. In the non-contact mode, priority is placed to stability and the number of program bits is set to two bits.

Seventh Embodiment

Figure 13:
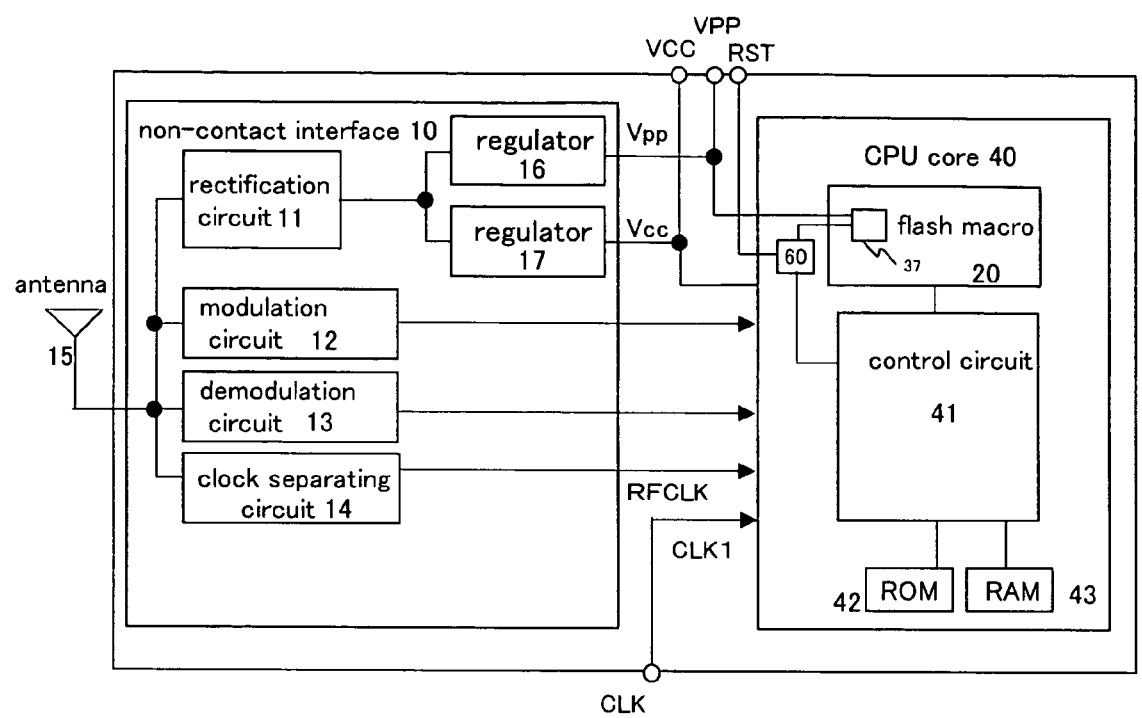
FIG. 13 is a block diagram showing the configuration in a seventh embodiment of the combination IC card having the nonvolatile semiconductor memory device according to the present invention.

As a seventh embodiment, an IC card according to the present invention having the inventive device will be described with reference to FIG. 13. A case of detecting that the operation is the contact operation or the non-contact operation by an external reset terminal RST and a circuit for detecting the rising of the power source voltage in a combination IC card and separately setting the number of program bits will be described.

In a reset state, the IC card initializes the circuit. Since there is no input from the external terminal in the non-contact operation, the rise of the power source voltage is detected and the circuit is initialized. When the IC card receives an electromagnetic wave, electromagnetic induction is caused by the antenna 15 buried in the IC card. A signal generated by the electromagnetic induction is converted to a positive voltage via the rectification circuit 11 and smoothed via the regulators 16 and 17. The resultant voltage is supplied as a power source to the CPU core 40. The power source voltage (Vcc and Vpp) of a general IC module is 5 V or 3.3 V. The rise of the power source voltage Vcc can be detected by a configuration such as the configuration of the voltage detection circuit 37 in FIG. 1. For example, when the power source voltage becomes higher than 2.0 V, the voltage detection circuit outputs a high-level signal, and a reset state is set for a predetermined period in response to the output signal of the voltage detection circuit. In the contact operation, by giving the low level to the external reset terminal RST or by detecting the rise of the power source voltage Vcc, the reset state is obtained. Since no signal is input in the non-contact operation, the external reset terminal RST is pulled up to the power source voltage (e.g., Vcc). The reset state is canceled in the contact operation either when the external reset terminal RST becomes the high level or in a predetermined period after the rise of the power source voltage Vcc, whichever is later.

In the seventh embodiment, a register 60 for storing the reset state is provided. The register 60 stores the state "1" when the voltage level of the external reset terminal RST becomes low, and the state "0" when the power source voltage Vcc is, for example, 2.0 V or less and the external reset terminal RST is at the high level. When the power source voltage Vcc is, for example, 2.0 V or more, the register 60 holds the value. In other words, even when the power source voltage Vcc rises, the external reset terminal RST becomes the high level, and the reset state is canceled, the register 60 holds "1". The control circuit 41 can determine either the contact mode or the non-contact mode in accordance with the value of the register 60. The number of program bits can be separately set in the contact mode and the non-contact mode. For example, in the contact mode, the stable powers as Vcc and Vpp are supplied from an external power source terminal, so that the number of program bits is set to four bits. In the non-contact mode, priority is placed to stability, assurance of the operation communication distance, and the like, and the number of program bits is set to two bits.

Also in the case of the power source voltage Vpp, the rise of the power source voltage can be detected by a configuration similar to that of the case of the power source voltage Vcc.

Although the inventive device and the IC card using the inventive device have been described above, the present invention is not limited to the first to seventh embodiments. For example, as a storage region constructed by nonvolatile memory cells, not only the flash memory cell array but also a storage region requiring a boosted voltage in rewriting such as an EEPROM array may be used.

Although the case where the memory cell stores binary data, that is, 1-bit data has been described as an example in the first to seventh embodiments, the memory cell may store multi-value data of three or more values. In such a case, although a program algorithm different from the algorithm shown in FIGS. 9 and 10 is used, the point in which the number of memory cells to which data is simultaneously programmed is set to an appropriate value in accordance with the voltage level of the power source voltage Vpp can be similarly applied.

The IC card using the inventive device is not limited to the combination IC card-but may be a non-contact IC card capable of executing power supply and signal communication in a non-contact manner.

Obviously, the inventive device is not limited to the IC card. The present invention can be also applied to the case where the current supply capability changes by battery drive for a portable telephone or the like. The inventive device and the IC card using the inventive device can be used by variously modifying the first to seventh embodiments without departing from the technical idea of the present invention.

As specifically described above, according to the present invention, the nonvolatile semiconductor memory device capable of stably rewriting a storage region constructed by a plurality of electrically rewritable nonvolatile memory cells even when the power supply capability is low or unstable can be provided.

Further, the present invention can also provide an IC card having a nonvolatile semiconductor memory device, in which data can be stably rewritten in a storage region even in the case where the power supply capability from the outside is restricted.

Although the present invention has been described in terms of preferred embodiments, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device comprising:
    a storage region constructed by a plurality of electrically rewritable nonvolatile memory cells;
    a booster circuit for boosting a power source voltage to thereby generate a voltage necessary to rewrite the storage region;
    a voltage determining part for determining a voltage level of a predetermined node in the semiconductor memory device in rewriting of the storage region; and
    a rewrite unit determining part for determining the number of bits of input data to be rewritten at once on the basis of a result of determination of the voltage determining part.

2. The nonvolatile semiconductor memory device according to claim 1, wherein
    the number of bits of the input data to be rewritten at once is the predetermined minimum unit, and
    when the voltage level of the predetermined node does not achieve a desired reference voltage, rewriting of the storage region with the data is inhibited.

3. The nonvolatile semiconductor memory device according to claim 1, wherein
the number of bits of the input data to be rewritten at once is a divisor of the total number of bits of the input data.

4. The nonvolatile semiconductor memory device according to claim 1, wherein
the number of the memory cells corresponding to the number of bits of the input data to be rewritten at once is the power of 2.

5. The nonvolatile semiconductor memory device according to claim 1, further comprising:
a batch rewriting determining part for determining whether a range to be rewritten in the storage region can be rewritten in a lump or not on the basis of a result of determination of the voltage determining part.

6. A nonvolatile semiconductor memory device comprising:
a storage region constructed by a plurality of electrically rewritable nonvolatile memory cells;
a booster circuit for boosting a power source voltage to thereby generate a voltage necessary to rewrite the storage region;
a voltage determining part for determining a voltage level of a predetermined node in the semiconductor memory device in rewriting of the storage region; and
a batch rewriting determining part for determining whether a range to be rewritten in the storage region can be rewritten in a lump or not on the basis of a result of determination of the voltage determining part.

7. The nonvolatile semiconductor memory device according to claim 1 or 6, wherein
the voltage determining part includes:
a voltage dividing circuit for dividing a voltage at the predetermined node;
a reference voltage generation circuit for outputting a reference voltage which is a constant voltage; and
a comparator for comparing the reference voltage output from the reference voltage generation circuit with an output voltage of the voltage dividing circuit.

8. The nonvolatile semiconductor memory device according to claim 7, wherein
current supply capability of the booster circuit is controlled on the basis of an output of comparison of the comparator.

9. The nonvolatile semiconductor memory device according to claim 1 or 6, wherein
the voltage at the predetermined node is a power source voltage.

10. The nonvolatile semiconductor memory device according to claim 1 or 6, wherein
the voltage at the predetermined node is an output voltage of the booster circuit.

11. The nonvolatile semiconductor memory device according to claim 1 or 6, wherein
the voltage at the predetermined node is at least one signal line voltage connected to the memory cell.

12. The nonvolatile semiconductor memory device according to claim 1 or 6, wherein
the voltage determining part determines the voltage level of the predetermined node each time a voltage necessary to rewrite the storage region is applied to the memory cell before application of the voltage.

13. The nonvolatile semiconductor memory device according to claim 1 or 6, wherein
the storage region is constructed by a flash memory capable of electrically programming input data and electrically erasing program data in a lump in a part or all of the storage region.

14. An IC card comprising the nonvolatile semiconductor memory device according to claim 1 or 6.

15. The IC card according to claim 14, wherein
the IC card is a non-contact IC card performing power supply and signal communication in a non-contact manner.

16. The IC card according to claim 14, wherein
the IC card is a contact/non-contact type combination IC card capable of executing power supply and signal communication in a non-contact manner and having a contact terminal for the power supply and the signal communication.

17. The IC card according to claim 16, wherein
a control method in rewriting of the storage region in the nonvolatile semiconductor memory device is switched according to a method of executing the power supply and the signal communication, which is either of the non-contact type or the contact type.

18. The IC card according to claim 17, further comprising:
a reset terminal; and a power source voltage detection circuit for detecting rise of a power source voltage, wherein
either the non-contact type or the contact type is determined on the basis of a signal input to the reset terminal and a signal output of the power source voltage detection circuit.

19. The IC card according to claim 17, further comprising:
a clock terminal; and an antenna coil, wherein
either the non-contact type or the contact type is determined on the basis of a frequency of a clock for the contact-type communication which is input from the clock terminal and a frequency of a clock for the non-contact-type communication received by the antenna coil.

* * * * *